United States Patent
Kumar et al.

(10) Patent No.: US 7,495,483 B2
(45) Date of Patent: Feb. 24, 2009

(54) INPUT BUFFER FOR CMOS INTEGRATED CIRCUITS

(75) Inventors: Niraj Kumar, Noida (IN); Vinayak Agrawal, Ghaziabad (IN); Paras Garg, Ghaziabad (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 97 days.

(21) Appl. No.: 11/475,846

(22) Filed: Jun. 27, 2006

(65) Prior Publication Data

US 2007/0057703 A1   Mar. 15, 2007

(30) Foreign Application Priority Data

Jun. 30, 2005   (IN)   ............... 1688/DEL/2005

(51) Int. Cl.
*H03B 1/00* (2006.01)
(52) U.S. Cl. .................. 327/112; 327/333; 326/62
(58) Field of Classification Search ......... 327/108–112, 327/306, 309, 318, 319, 323, 333; 326/62, 326/63, 83
See application file for complete search history.

(56) References Cited

U.S. PATENT DOCUMENTS

| | | | |
|---|---|---|---|
| 5,465,054 A * | 11/1995 | Erhart .................. 326/34 |
| 5,939,932 A * | 8/1999 | Lee ..................... 327/436 |
| 6,184,704 B1 | 2/2001 | Wang et al. |
| 6,236,236 B1 * | 5/2001 | Chen ..................... 326/81 |
| 6,346,829 B1 * | 2/2002 | Coddington ............. 326/81 |
| 6,392,440 B2 * | 5/2002 | Nebel ..................... 326/81 |
| 6,784,700 B1 * | 8/2004 | Hunt et al. ............. 327/108 |
| 6,784,717 B1 * | 8/2004 | Hunt et al. ............. 327/318 |
| 2005/0286333 A1 * | 12/2005 | Gupta et al. ........... 365/226 |

* cited by examiner

*Primary Examiner*—Lincoln Donovan
*Assistant Examiner*—Hai L. Nguyen
(74) *Attorney, Agent, or Firm*—Gardere Wynne Sewell LLP

(57) ABSTRACT

An input buffer for CMOS integrated circuits using sub-micron CMOS technology is affected by the presence of high voltage between various ports of a device. An improvement for such a buffer provides an input voltage limiting circuit making the device mode tolerant to high voltages while using low voltage tolerant CMOS devices. This improvement also reduces the switching level uncertainty due to manufacturing process variations by adding compensation devices to a first inverter stage in the input buffering stage so as to increase noise margin. A hysteresis characteristic is produced by the circuit thus reducing the effect of manufacturing process variation. The circuit can be easily interfaced to other blocks and safely operates in conjunction with relatively high voltage CMOS technology circuitry while achieving the high-speed advantage of thin gate oxide. Low power consumption is achieved by avoiding the possibility of DC current flow in the circuitry.

20 Claims, 6 Drawing Sheets

US 7,495,483 B2

INPUT BUFFER FOR CMOS INTEGRATED CIRCUITS

PRIORITY CLAIM

The present application claims priority from Indian Application for Patent No. 1688/Del/2005 filed Jun. 30, 2005, the disclosure of which is hereby incorporated by reference.

BACKGROUND OF THE INVENTION

1. Technical Field of the Invention

The present invention relates to an improved input buffer for CMOS integrated circuits.

2. Description of Related Art

Input buffers are a very important subsystem for various blocks on Application Specific Integrated Circuits (ASICs). The input buffers are used as peripheral devices in a block for receiving data from other on-chip devices or external systems. As the operating speed of different blocks in a system varies, the circuitry is also used for buffering the input to the block. Further, the circuitry is used for reducing the parasitic input capacitance of the system as the total input capacitance is reduced to the parasitic input capacitance of the input buffer. Simple input blocks comprise a chain of inverter stages or Schmitt trigger circuitry for input buffering and input capacitance reduction. In order to attain minimum specified noise tolerance, an input low voltage, VIL, and an input high voltage, VIH, switch levels are specified.

With increasing complexity of ASICs, simple buffering and capacitance reduction is not sufficient for modern input circuitry. These systems have to communicate with several other systems working at different voltages. Hence the modern ASIC input buffers must provide protection for the CMOS devices inside the systems during interaction with other local logic blocks or external systems.

At process level, the device dimensions are continuously shrinking to sub-micron technology. Such sub-micron technology devices cannot tolerate high input voltage because of reliability issues due to gate oxide breakdown and punch-through effect. The gate-oxide breakdown voltage and/or the punchthrough voltage between source and drain are the parameters used to define the maximum input voltage allowed between various nodes of a CMOS device. These devices can operate without experiencing stress due to gate oxide breakdown and punchthrough effects while the input transistor voltages |VGS|, |VDS| and |VGD| do not exceed a prescribed voltage. This has led to the development of low cost and low power integrated circuits requiring lower supply voltages.

With continuous reduction in the CMOS technology sizes and supply voltages, circuit designing for standard protocols is getting more challenging. To meet the standard protocols' electrical specifications, interface circuits using submicron technology devices must work at high input and supply voltages (e.g., 5V, 3.3 V and the like) with high reliability. Interfacing the low-voltage input buffers with high voltage circuitry is a major problem as high input voltage may result in devices experiencing temporary failure or in worst case it may even result in permanent damage to the device. The gate-oxide stress due to high input voltage causes threshold voltage of the device to fluctuate because of tunneling effect and results in reduced device lifetime. To overcome this problem, increasing gate oxide width and using an extended drain scheme can fabricate high voltage tolerant transistors. However, these devices increase the fabrication cost as the process requires extra masks to make device level tuning in the same CMOS baseline process. The fabrication process also results in performance degradation.

Another problem with using low voltage input buffers arises due to increasingly smaller difference between the voltage switch levels (VIL and VIH). An important parameter in these buffers is the toggle voltage, Vtgl, which is defined as the input voltage of an inverter chain, which produces 0.5Vdd at the output for supply voltage Vdd. The toggle voltage Vtgl is used as switching level for the logic in the digital circuits and this value lies between VIH and VIL. The minimum of the difference between Vtgl and VIH and Vtgl and VIL is used to determine the noise margin for the input buffer. For instance, if VIL is at 0.4Vdd and VIH is at 0.6Vdd, Vtgl must lie within the switching window of 0.2Vdd and the maximum noise margin is 0.1Vdd. As a result of reduction in the supply voltage, the switching window is getting progressively smaller resulting in reduced noise margin. This is a cause of concern as the variation in the integrated circuit manufacturing process can introduce a shift in the input switching voltage level Vtgl and result in further reduction in the noise margin for the circuitry.

FIG. 1 is a schematic diagram of a simple 5V tolerant input buffer operating at 3.3V nominal supply voltage. All CMOS devices used in the input buffer are designed in 3.3V CMOS technology. IN is connected to the drain of MOSFET M1, which translates the input signal to a lower voltage at the input node of the buffer for safe operation. When IN receives an input as high as 5V, the input node of the buffer is clamped to (VDDS-VtM1). Because of the substrate bias effect, the threshold voltage Vt of transistor M1 is high (over 1 V) and the buffer input node voltage is comparatively low resulting in safe transistor operation. However if VtM1 is too high, the buffer input node voltage is not sufficiently high resulting in static power consumption as two transistors in the input buffer are in weak inversion or strong sub-threshold mode. Moreover this structure cannot be used for low voltage CMOS devices (i.e. 2.5V) with a high supply voltage (i.e. 3.3V).

FIG. 2 is a schematic diagram of a prior art process compensated input buffer (see, for example, U.S. Pat. No. 6,184,704 to Wang et al.). An improved CMOS input buffer is shown. This improvement reduces the switching level uncertainty range and thus increases the noise margin by compensating for the manufacturing process variations. The invention uses diode connected Px and Nx transistors as resistive compensation devices in the first stage of a multistage digital input buffer. Threshold loss is compensated for by Pt, Nt devices in parallel with Nx, Px respectively. However, as the source of Pt is connected with the gate and drain of device Nx, this circuit does not provide independent control for process variation. Additionally compensation device is not on throughout the transition. Also, this structure cannot be used with low input voltage (i.e., 2.5V) with the input buffer having higher supply voltage (i.e., 3.3V).

Hence, there is need for an input buffer, which is capable of receiving a high input and supply voltage without experiencing degradation of gate oxide lifetime. Further there is need for an input buffer that provides good noise margin with process, temperature and voltage variation. Additionally, there is need for an input buffer that does not need increased process complexity in low voltage CMOS devices for protection against higher input and supply voltages.

SUMMARY OF THE INVENTION

An embodiment of the present invention providing an improved input buffer for CMOS integrated circuits addresses the aforesaid drawbacks of the prior art. Advantageously, the buffer provides for reduced process induced variation in voltage logic thresholds of a CMOS input buffer.

An embodiment of the invention is also a method to design a robust CMOS input buffer using thin gate oxide transistors able to work with input voltage levels exceeding the tolerable voltage levels for the semiconductor devices used.

In accordance with an aspect of the invention, a means of shifting the voltage levels of input signals to tolerable limits for use by other circuits is provided.

In accordance with an aspect of the invention, a high-speed input buffer with low power consumption is provided.

In accordance with an aspect of the invention, immunity against noise in the input signal is provided.

An improved input buffer for CMOS integrated circuits comprises: a pair of internally generated high and low reference voltages that lie within the voltage rating of the low voltage switching devices; an input voltage limiting circuit that utilizes said reference voltages to limit the input voltage signal to said low voltage switching devices; and a plurality of parallel connected inverters comprising a cascade of said low voltage switching devices biased using said reference voltages to limit the supply voltage stress and a compensation means for reducing the effects of manufacturing process variation, coupled to the output of said voltage limiting circuit.

An embodiment of the invention provides a controlled parallel path of N-type for charging and p-type for discharging in the first inverter stage of a multistage digital input buffer. These added components precisely control the transfer characteristics in case of manufacturing process variations. Here process variation refers to the drive ability of PMOS and NMOS devices. It is particularly troublesome when the NMOS devices have high drive ability and PMOS have low drive ability or when the PMOS devices have high drive ability and NMOS have low drive ability. The first case is referred as NSPF (NMOS slow PMOS fast) and the opposite case is referred as NFPS (NMOS fast PMOS slow). The input limiting circuit protects the transistors in the parallel connected inverter stage against high input voltage.

In an embodiment, a circuit coupled to a high voltage reference and ground reference comprises: an input node receiving an input signal; a first p-channel transistor having a gate terminal selectively coupled to receive an intermediate low voltage between the high voltage reference and ground reference and including a source/drain circuit connected on one side to the input node to generate on another side a first voltage limited input; and a first n-channel transistor having a gate terminal selectively coupled to receive an intermediate high voltage between the high voltage reference and ground reference and including a source/drain circuit connected on one side to the input node to generate on another side a second voltage limited input.

A multistage input buffering circuit is coupled to receive the first and second voltage limited inputs. The multistage input buffering circuit comprises a first inverter stage receiving the first and second voltage limited inputs, and a second inverter stage buffering an output of the first inverter stage to provide a circuit output. The first inverter stage comprises a first CMOS inverter circuit including source/drain circuit series connected transistors which are separately gate driven by the first and second voltage limited inputs and the intermediate low and high voltages. The first inverter stage further comprises a second CMOS inverter circuit including source/drain circuit series connected transistors which are separately gate driven by the first and second voltage limited inputs, the intermediate low and high voltages, and source/drain interconnection node voltages taken from the first CMOS inverter circuit. The output of the first inverter stage is a center drain interconnection node of the source/drain circuit series connected transistors for the first CMOS inverter circuit which is connected to a center source interconnection node of the source/drain circuit series connected transistors for the second CMOS inverter circuit.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

The current invention is a high voltage tolerant input buffer using sub-micron CMOS technology. The invention provides additional input voltage limiting circuit resulting in a high voltage (3.3V or 5V) tolerant input buffer with low voltage tolerant CMOS devices. This improvement also reduces the switching level uncertainty due to manufacturing process variations by adding compensation devices and thus increases the noise margin. The hysteresis characteristic produced by the circuit has reduced the effect of manufacturing process variation. The circuit can be easily interfaced to other blocks and safely operates in conjunction with relatively high voltage CMOS technology circuitry while achieving the high-speed advantage of thin gate oxide. Low power consumption is achieved by avoiding any possibility of DC current flow in the circuitry.

Figure 1:
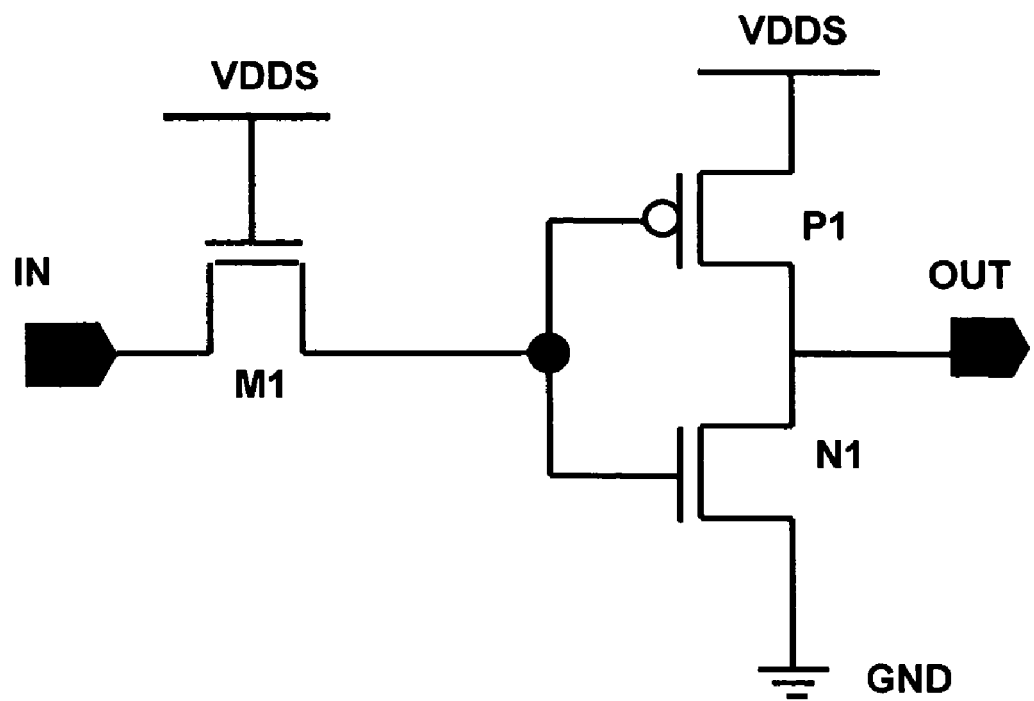
FIG. 1 illustrates a schematic diagram of a conventional prior art 5V tolerant input buffer.
Figure 2:
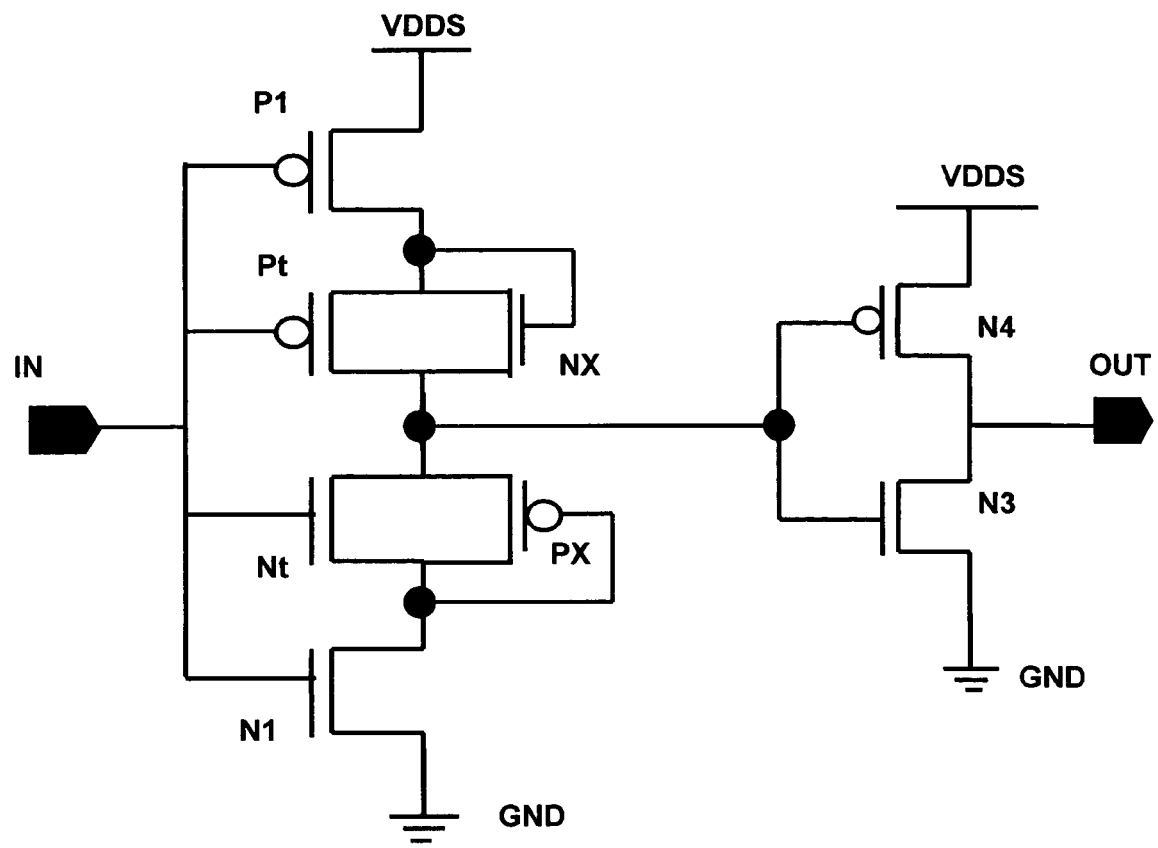
FIG. 2 illustrates a schematic diagram of a prior art process compensated input buffer made with diode connected devices.
Figure 3:
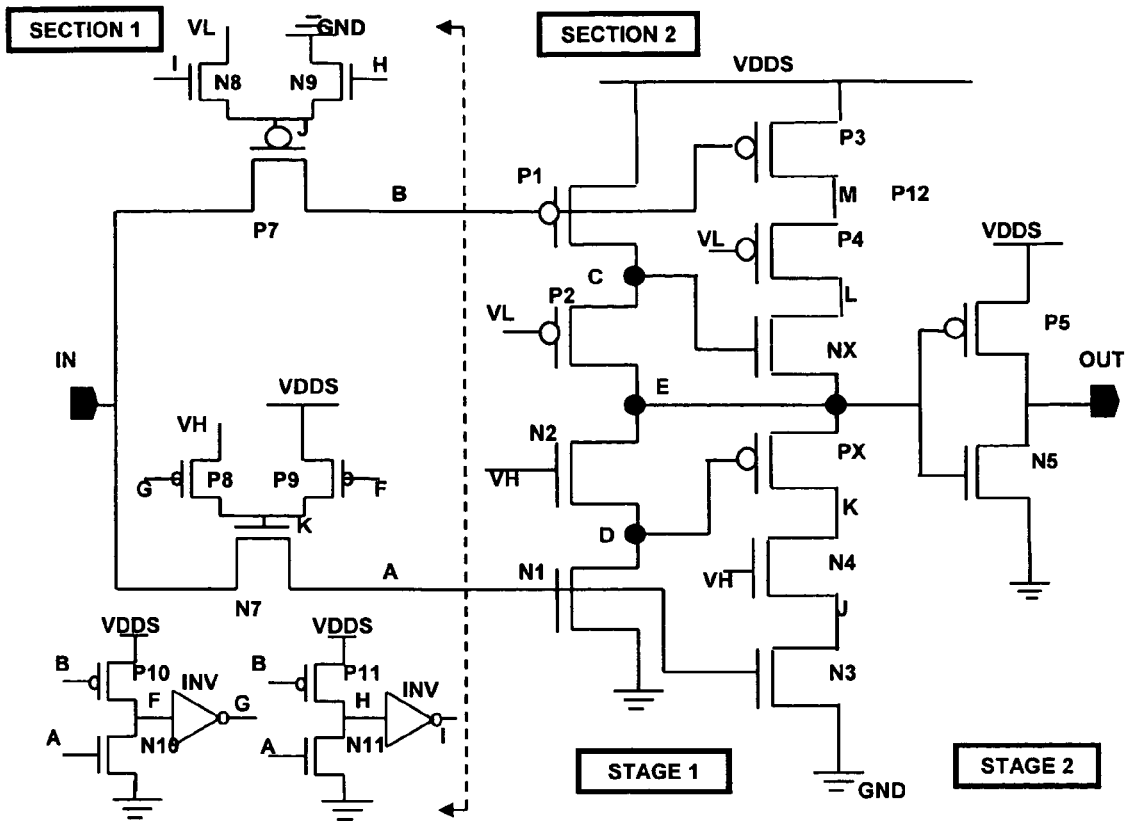
FIG. 3 illustrates a schematic diagram of a proposed circuit for an improved input buffer made with low voltage devices in accordance with the instant invention.

FIG. 3 illustrates a schematic diagram of proposed multistage input buffer. The instant invention is divided into two sections based on their operation. Section 1 is the proposed input voltage limiting circuit, which protects the input transistors in Section 2. Section 2 is a multistage input buffering circuitry where a first stage is a modified CMOS inverter stage. The first inverter stage is coupled to a second or buffer stage to produce a delayed output. The preferred embodiment of the invention discussed herein is for input circuitry with two inverter stages. Furthermore, for describing the functionality of the circuit, nominal values for supply and reference voltages as well as input signal level are taken in one of its embodiments. The voltage supply VDDS is 3.3V, and all devices are in low voltage (2.5V) CMOS technology and can operate without experiencing stress while the input transistor voltages |VGS|, |VDS|, |VGD| and |VGB| do not exceed 2.8V. Two reference voltages VL and VH with the typical values of 0.7 V and 2.5 V respectively, are used in the input buffer for protection of CMOS devices. The first inverter stage is modified to provide compensation for manufacturing process variations and simultaneously protect the input transistors from supply voltage stress. The second inverter stage is used to provide buffering of the signal output from the first inverter stage.

The input voltage limiting circuit in Section 1 comprises NMOS transistors N7, N8, N9, N10 and N11, PMOS transistors P7, P8, P9, P10 and P11, and two inverters INV. IN is the input signal which varies between (0-3.6V) and is connected to node A and B through transistors N7 and P7 respectively. The gate node K of transistor N7 is connected to the coupled source node of transistors P8 and P9 and the drain nodes of transistors P8 and P9 are connected to VH and VDDS respectively. Depending on IN, the gate nodes G and F of transistors P8 and P9 are controlled by transistors N10, P10 and INV. Transistors N10 and P10 are series connected to form an inverter stage with B and A connected at the gate nodes of transistors P10 and N10 respectively. The source node of transistors N10 is connected to the ground and the drain node of transistor P10 is connected to VH. The output signal at the common node F between transistors N10 and P10 is fed to an inverter INV with output node G.

Similarly, the gate node J of transistor P7 is connected to the coupled source nodes of transistors N8 and N9 and the drain nodes of transistors N8 and N9 are connected to the VL and GND respectively. Depending on IN, the gate nodes I and H of transistors N8 and N9 are controlled by transistors N11, P11 and INV. Transistors N11 and P11 are series connected to form an inverter stage with node B and A connected at the gate nodes of transistors P11 and N11, respectively. The source node of transistor N11 is connected to the ground and the drain node of transistor P11 is connected to VH. The output signal at common node H between transistors P11 and N11 is fed to an inverter INV with output node I.

The modified inverter stage in Section 2 comprises NMOS transistors N1, N2, N3, N4, and NX, and PMOS transistors P1, P2, P3, P4, and PX. The first inverter stage of the input buffering circuitry (Section 2) has transistors P1 and P2 connected in series to form a pull-up network and transistors N1 and N2 connected in series to form a pull-down network. While the gate nodes of transistors P2 and N2 are connected to VL and VH reference voltages respectively, the gate nodes of transistors P1 and N1 are connected to node B and node A respectively. The output of first inverter stage is the common node E between transistors P2 and N2. A parallel path comprising transistors P3, P4 and NX connected in series and transistors N3, N4 and PX connected in series are used to form pull-up and pull-down network respectively. The gate node of transistor NX is connected to the common node C between transistors P1 and P2, and the gate nodes of transistors P3 and P4 are connected to B and VL respectively. The gate node of transistor PX is connected to the common node D between transistors N2 and N1, and gate nodes of transistors N3 and N4 are connected to A and VH respectively. Further common node between NX and PX is coupled to the output node E of the first inverter stage. Second inverter stage in the input buffering circuitry consists of transistors N5 and P5 connected in series to form a conventional inverter with the output signal of first inverter stage connected to the common gate node of transistors N5 and P5. Transistors N5 and P5 are not stressed by the input and supply voltages, as the stress time is minimal due to the steep rise time of signal at E and fast clock operations The input voltage limiting circuit is used to protect the input transistors P1, P2, N1, N2, P3, N3 of the input buffering circuitry from stress by preventing |VGS|, |VDS|, |VGB| and |VGD| from exceeding the voltage of 2.5V. When IN is at logic high, F is at logic low and G is at logic high, so VDDS is applied at the gate node of transistors N7 through P9. Hence, the maximum value at A is (VDDS-vtN7) which is less than VH so transistors N1, N2 and N3 are safe from stress. Transistor P7 is also not stressed in the process. H is at logic low and I is at logic high, so VL is applied to the gate node of transistors P7 through N8 and hence transistor P7 is not stressed either. Similarly, when IN is at logic low, H is at logic high and I is at logic low, so GND is applied at the gate node of transistors P7 through N9. This ensures that the minimum voltage at B is |vtP7| and as the value (VDDS-|vtP7|) is less than VH, so transistors P1 and P3 are safe from stress. In this case F is at logic high and G is at logic low, so VH is applied to the gate of transistor N7 through transistor P8 and hence transistor N7 is not stressed.

Therefore, the input voltage limiting circuit passes signal IN unaltered to node A and node B while IN is in the range of |VL| to |VH|. However, on exceeding the |VH|, the signal at node A is clamped at (VDDS-VtN7) to protect transistors N1, N2, N3 and N7. On the other hand, the signal at node B is clamped at |VtP7| while IN is less than |VL| to protect transistors P1, P2, P3 and P7. The switching threshold for inverter with transistors N10 and P10 is kept slightly more than VL while that of inverter with transistors N11 and P11 is kept slightly less than VH in order to insure the voltages at A and B follow IN in transition of signal at IN. Simultaneously, the switching threshold voltages are kept at levels so input transition should not result in stress on transistors N7 and P7. When IN is changing from logic high to logic low, the initial voltages at J and K are VL and VDDS respectively. When IN reaches below VH, the voltage at J changes from VL to GND and the voltage at B follows the input at IN. The transition of J at this point also ensures the unstressed operation of device P7. Similarly, when IN is changing from low to high, the initial voltages at J and K are at GND and VH respectively. When IN reaches above VL, the voltage at K must change from VH to VDDS in order for voltage at A to follow input at IN.

The first inverter stage is modified to provide device protection as well as reduced power consumption. The parallel path in the first inverter stage is used to reduce the effects of manufacturing process variations and thus increase the noise margins. There is no static current path through transistors P1, P2, N1, N2 and transistors P3, NX, PX, N3 as when the input is at logic high, node B connected to transistors P1 and P3 is at logic high and when input is at logic low, node A connected to transistors N1 and N3 is at logic low. Output node E of the first inverter stage swings from 0 to 3.3 volt (up to 3.6 volt in worst case) as it is directly connected to 3.3V power supply. When pull-down network (NMOS structure of transistors N1 and N2) is off and pull-up network (PMOS structure of transistors P1 and P2) is on, E is at 3.3V for typical case. Because of cascading of transistors N1 and N2 VDS (drain to source voltage) of these two transistors is less than 2.5 V and VDG (drain to gate voltage) of transistor N2 is approximately 0.8V. In worst case it will be 1.1V when VDDS is 3.6V. When pull-down network is on and pull-up network is off, E is at 0V. Again transistors P1 and P2 are free from |VDS| stress and |VGD| of transistor P2 is only 0.7 volt. Also |VGB| (the gate to bulk voltage) of transistors P2 and N2 are 2.6 volt and 2.5V respectively. Transistors P2 and N2 are also used to control reference signals at node C and node D connected to the compensation devices PX and NX in the parallel path.

The parallel path with pull-up network of transistors P3, P4, and NX and the pull-down network of transistors N3, N4, and PX is inserted into the first inverter stage for compensating for manufacturing process variations. Transistor PX is connected as a compensation device along with NMOS devices in the pull-down path of the parallel path and transistor NX is connected as a compensation device along with the PMOS devices in the pull-up path. Transistors PX and NX are used to decrease/increase the drive ability of the pull-up/down network in the inverter stage. Transistors P3, N3 transistors are used in the parallel pull-up and pull-down path to avoid the static current path through transistors NX and PX respectively. Similar to transistors P2 and N2, transistors P4 and N4 with their gate nodes connected to VL and VH respectively are used in cascade with transistors P3 and N3 to protect transistors P3 and N3 from voltage stress.

Hence, when IN is low, A is at Zero and B is at |VtP7|. Output of the first inverter stage is VDDS, as transistors N1 and N3 are off. D is at (VH-VtN2) which keeps transistor PX on, so K is at VDDS and J is at (VH-VtN3). When input increases to VtN1 both transistors N1 and N3 are turned on simultaneously and provide a pull-down path for E through transistors N2 and PX. The switching point of E is decided by the aspect ratios of transistors P2 and NX in pull-up path and transistors N2 and PX in pull-down path. As NMOS and PMOS devices are both present in pull-down and pull-up network, addition of transistors PX and NX greatly reduces the switching uncertainty range of the buffer throughout manufacturing process variation especially in cross corners (NSPF or NFPS). In addition to this, a second inverter stage is used to provide buffering of the signal coming from the first inverter stage. Also, as the added compensating devices work in the forward path in the input buffer, proposed circuit is suitable for high-speed operation.

Figure 5:
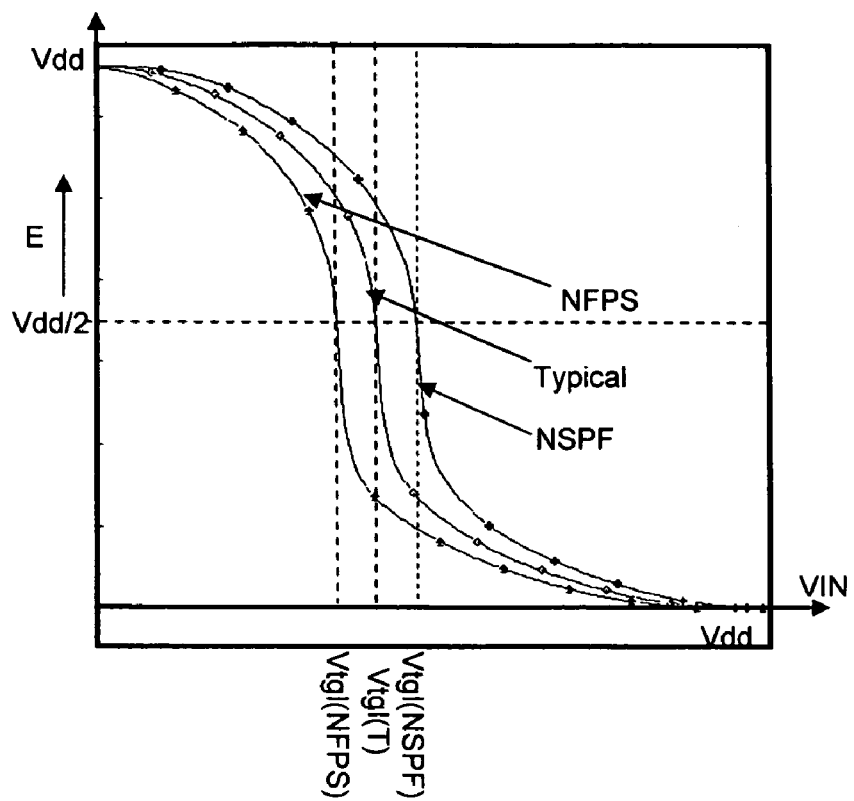
FIG. 5 shows the effect of process variation on the transfer curve of the first stage inverter in an uncompensated digital input buffer.

FIG. 5 illustrates the effect of process variation on the transfer curve of digital input buffer without compensation. The figure illustrates three transfer curves signifying a typical (normal) case, NSPF case and NFPS case. E is the voltage output of the first inverter stage of the input buffering stage and VIN is voltage input to the input buffer. Vtgl (T) is the switching voltage level for typical NMOS and PMOS process. Vtgl (NSPF) and Vtgl (NFPS) are the switching voltage levels for NMOS slow PMOS fast and NMOS fast and PMOS slow cases. The NSPF and NFPS transfer curves are shifted with respect to the typical case. Hence to protect against erroneous operation due to manufacturing process variations, the output may vary in the range of Vtgl(NSPF) and Vtgl (NFPS) in an uncompensated input buffer.

Figure 6:
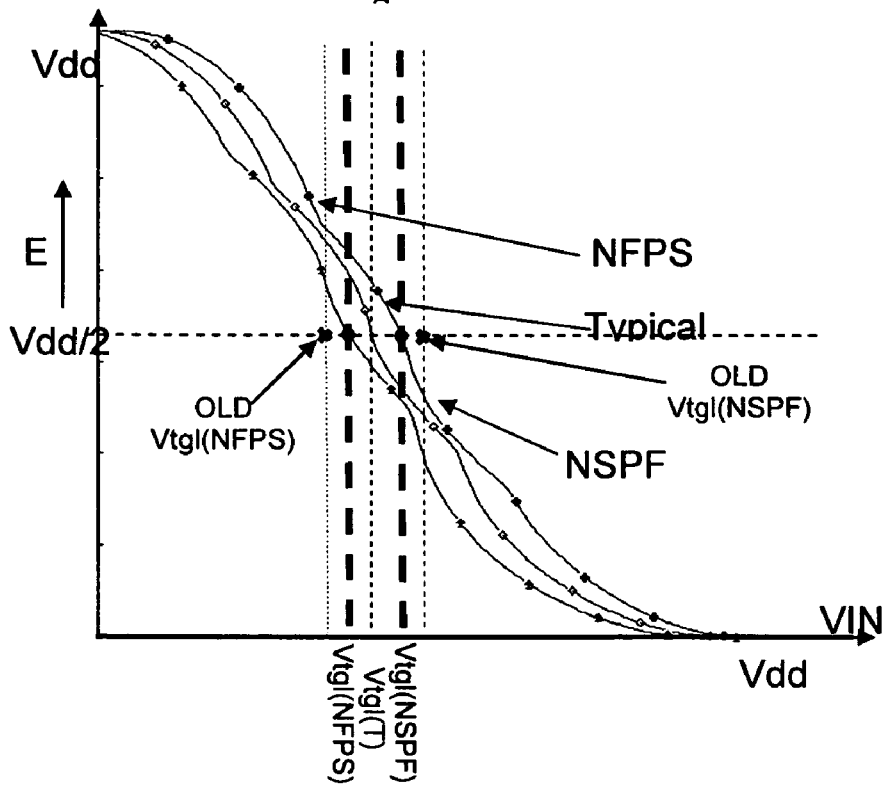
FIG. 6 shows the transfer curve of proposed input buffer, with considerable reduction in switching uncertainty in accordance with the instant invention.

FIG. 6 illustrates the transfer curves of the first inverter stage of the input buffer in the instant invention. E is the voltage output of the first stage of the first inverter stage in input buffering stage and VIN is the voltage input to the input buffer. Three transfer curves of comprising typical, NSPF and PSNF are shown and the triggering voltages (Vtgl (NSPF) and Vtgl (NFPS)) are compared with respect to the uncompensated case. Addition of compensation devices reduces the gain of the transfer characteristic, making it more controllable during the transition period, as the devices NX, and PX begin to conduct whenever there gate to source voltage is greater than VtNX or |VtPX|. As pull-up and pull-down path of proposed circuit contain both NMOS and PMOS in their parallel path, the manufacturing process variation in one is compensated by the other, causing less deviation of triggering point at cross corners.

Figure 7:
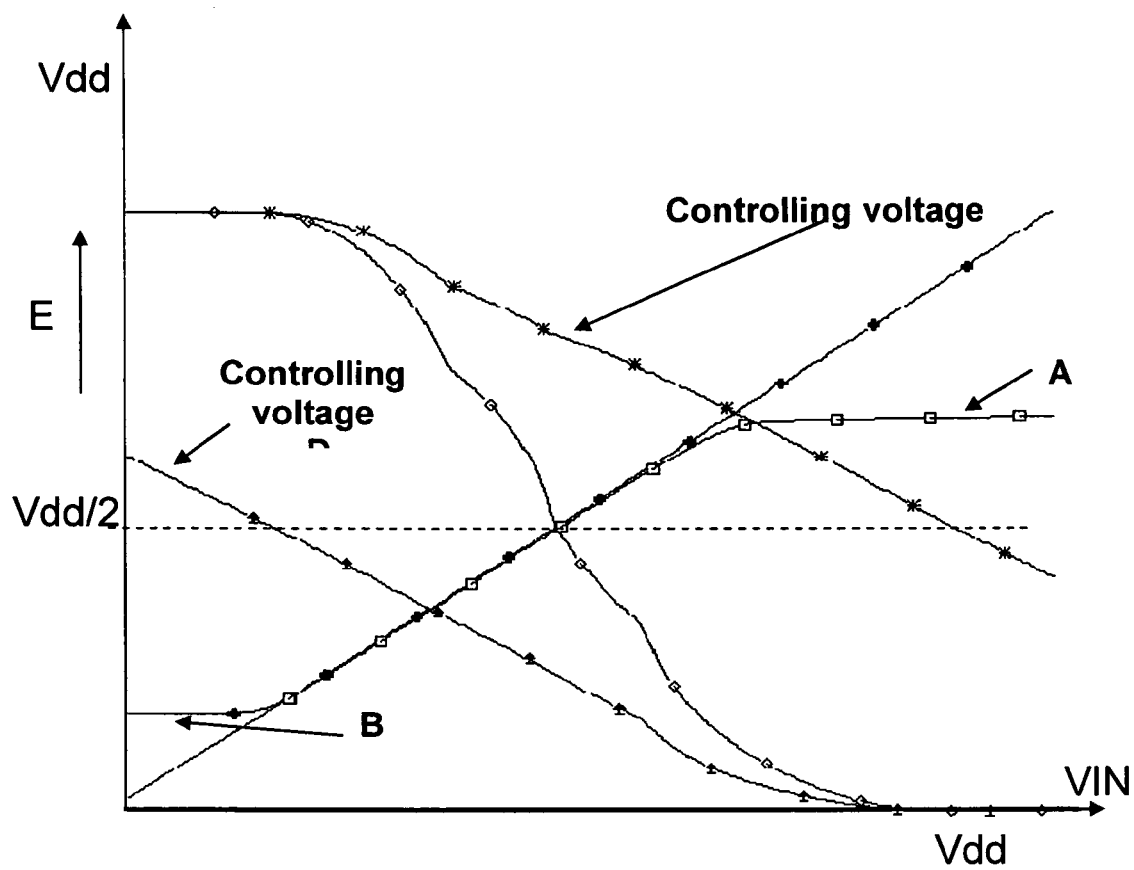
FIG. 7 illustrates the internal node voltages with compensation in accordance with the instant invention.

FIG. 7 illustrates the internal node voltages of the first inverter stage of Section 2, where VIN varies from Zero to VDDS. Controlling gate voltages C and D of transistors NX and PX vary linearly, and precisely control the transfer characteristic of node E throughout the transition range. It also shows the node voltages A and B as the input voltage limiting circuit output clamped to allow stress free operation of Section 2.

Figure 4:
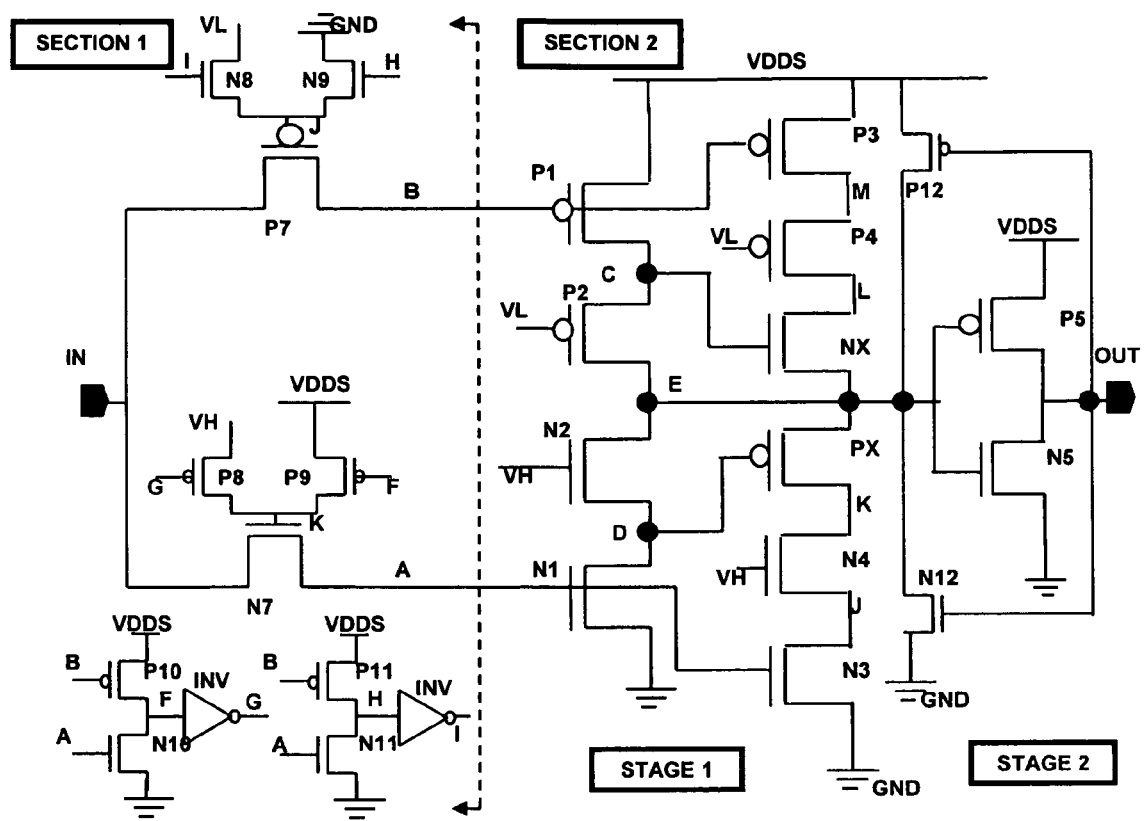
FIG. 4 illustrates a schematic diagram of a Schmitt trigger using an improved input buffer in accordance with the instant invention.

FIG. 4 illustrates another embodiment of the present invention using the Schmitt trigger in the proposed process compensated input buffer. Transistors P12 and N12 are added to the input buffer in feedback path with the output of the input buffer OUT connected to the gates of PMOS P12 and NMOS N12. The devices P12 and N12 are connected in series to form an inverter with output connected to E. Hence the output OUT is inverted and fed back to the second inverter stage resulting in reduction of noise.

Hence, while the invention has been particularly shown and described with reference to the preferred embodiments thereof, it will be understood by those skilled in the art that various changes in form and details may be made without departing from the spirit and scope of the invention. In case where high voltage devices are available, we do not need reference signals VL and VH to protect devices from stress. An alternative connection of Section 2 where the gates of transistors P1, P2, N1, N2, P3, N3 are connected to IN, node G is connected to node F and node H is connected to node I also applies for the instant invention.

This invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

What is claimed is:

1. An input buffer for CMOS integrated circuits, comprising:
   a pair of internally generated high and low reference voltages that lie within a voltage ratings of included low voltage switching devices;
   an input voltage limiting circuit that utilizes said reference voltages to limit an input to said low voltage switching devices at first and second outputs; and
   a plurality of parallel connected inverters coupled to the first and second outputs of said input voltage limiting circuit and comprising a cascade of said low voltage switching devices biased using said reference voltages to limit supply voltage stress and compensation means for reducing effects of manufacturing process variation;
   wherein said parallel connected inverters comprise:
      a first P-type FET connected to a supply voltage at its source and connected at its gate to said second output;
      a first resistive P-type FET connected to a drain of said first P-type FET at its source and connected at its gate to the low reference voltage;
      a first resistive N-type FET connected at a first common node to a drain of said first resistive P-type FET at its drain and connected at its gate to the high reference voltage;
      a first N-type FET connected to a ground at its source, connected at its drain to a source of the first resistive N-type FET, and connected at its gate to said first output;
      a second P-type FET connected to the supply voltage at its source and connected at its gate to said second output;
      a second resistive P-type FET connected to a drain of said second P-type FET at its source and connected at its gate to the low reference voltage;

a compensation N-type FET connected to a drain of said second resistive P-type FET at its drain and connected at its gate to a second common node at the drain of said first P-type FET and the source of said first resistive P-type FET;

a compensation P-type FET connected at a third common node to the source of said compensation N-type FET at its source and connected at its gate to a fourth common node at the drain of said first N-type FET and source of said first resistive N-type FET;

a second resistive N-type FET connected to a drain of said compensation P-type FET at its drain and connected at its gate to the high reference voltage;

a second N-type FET connected to the ground at its source and connected to the source of said second resistive N-type FET at its drain, and connected at its gate to said first output; and a connection between the first common node and the third common node for generating the output for said parallel connected inverters.

2. An input buffer for CMOS integrated circuits, comprising:

a pair of internally generated high and low reference voltages that lie within a voltage ratings of included low voltage switching devices;

an input voltage limiting circuit that utilizes said reference voltages to limit an input to said low voltage switching devices;

a plurality of connected inverters comprising a cascade of said low voltage switching devices biased using said reference voltages to limit supply voltage stress; and a compensation means for reducing effects of manufacturing process variation, coupled to the output of said input voltage limiting circuit;

wherein said input voltage limiting circuit comprises:

a first output generator receiving a first control signal and its complementary signal for clamping said input and generating said first output;

a second output generator receiving a second control signal and its complementary signal for clamping said input and generating said second output; and a control signal generator receiving said first and second output for generating said first and second control signals and their complimentary signals.

3. The input buffer as claimed in claim 2, wherein said first output generator comprises:

a first N-type FET connected to said input at its drain for generating said first output at its source;

a first P-type FET connected to the voltage supply at its source and connected to the first control signal at its gate;

a second P-type FET connected to the high reference voltage at its source and connected to the complementary signal of first control signal at its gate; and a connection from the coupled drain of said first P-type FET and said second P-type FET to the gate of said first N-type FET.

4. The input buffer as claimed in claim 2, wherein said second output generator comprises:

a third P-type FET connected to said input at its drain for generating said second output at its source;

a second N-type FET connected to ground at its source and connected to the second control signal at its gate;

a third N-type FET connected to the low reference voltage at its source and connected to the complimentary signal of second control signal at its gate; and a connection from the coupled drain of said second N-type FET and said third N-type FET to the gate of said third P-type FET.

5. The input buffer as claimed in claim 2, wherein said control signal generator comprises:

a fourth N-type FET connected to said first output at its gate and connected to ground at its source;

a fourth P-type FET connected to said second output at its gate and connected to said high reference voltage at its drain;

a first inverter receiving a first control signal from the coupled node between said fourth P-type FET and said fourth N-type FET;

a fifth N-type FET connected to said first output at its gate and connected to ground at its source;

a fifth P-type FET connected to said second output at its gate and connected to said high reference voltage at its drain; and a second inverter receiving a second control signal from the coupled node between said fifth P-type FET and said fifth N-type FET.

6. An input buffer for CMOS integrated circuits, comprising:

a pair of internally generated high and low reference voltages that lie within a voltage ratings of included low voltage switching devices;

an input voltage limiting circuit that utilizes said reference voltages to limit an input to said low voltage switching devices;

a plurality of connected inverters comprising a cascade of said low voltage switching devices biased using said reference voltages to limit supply voltage stress; and a compensation means for reducing effects of manufacturing process variation, wherein said compensation means comprises a compensation P-type FET and a compensation N-type FET connected in series with each other between pull up and pull down devices in a latter one of the inverters in the cascade, these compensation FETs being gate controlled by signals generated by an earlier one of the inverters in the cascade and functioning to reduce effects of manufacturing process variation.

7. The input buffer as claimed in claim 6, wherein said switching devices are MOSFET devices.

8. The input buffer as claimed in claim 6, wherein said compensation P-type FET is coupled between the pull down device and an output node of the latter inverter and said compensation N-type FET is coupled between the pull up device and the output node of the latter inverter.

9. The input buffer as claimed in claim 6, wherein said FETs are MOSFET devices.

10. The input buffer as claimed in claim 6, wherein an output of said latter connected inverter is connected to a buffer stage to hold the output.

11. The input buffer as claimed in claim 10, wherein an output of buffer stage is fed back to the output of said latter connected inverter through an additional inverter stage to form a Schmitt Trigger buffer stage to increase the noise immunity.

12. A circuit coupled to a high voltage reference and ground reference, comprising:

an input node receiving an input signal;

a first p-channel transistor having a gate terminal selectively coupled to receive one of the ground reference and an intermediate low voltage between the high voltage reference and ground reference and including a source/drain circuit connected on one side to the input node to generate on another side a first voltage limited input;

a first n-channel transistor having a gate terminal selectively coupled to receive one of the high voltage reference and an intermediate high voltage between the high voltage reference and ground reference and including a source/drain circuit connected on one side to the input node to generate on another side a second voltage limited input;

a first selective coupling circuit responsive to a first selection signal for applying either the intermediate low voltage or the ground reference to the gate terminal of the first p-channel transistor based on a first selection signal state; and a second selective coupling circuit responsive to a second selection signal for applying either the intermediate high voltage or the high voltage reference to the gate terminal of the second p-channel transistor based on a second selection signal state.

13. A circuit coupled to a high voltage reference and ground reference, comprising:

an input node receiving an input signal;

a first p-channel transistor having a gate terminal selectively coupled to receive an intermediate low voltage between the high voltage reference and ground reference and including a source/drain circuit connected on one side to the input node to generate on another side a first voltage limited input;

a first n-channel transistor having a gate terminal selectively coupled to receive an intermediate high voltage between the high voltage reference and ground reference and including a source/drain circuit connected on one side to the input node to generate on another side a second voltage limited input;

a first logic circuit for logically combining the first and second voltage limited inputs to generate a first selection signal for controlling selective application of the intermediate low voltage to the gate terminal of the first p-channel transistor; and a second logic circuit for logically combining the first and second voltage limited inputs to generate a second selection signal for controlling selective application of the intermediate high voltage to the gate terminal of the second p-channel transistor.

14. A circuit coupled to a high voltage reference and ground reference, comprising:

an input node receiving an input signal;

a first p-channel transistor having a gate terminal;

a first circuit to selectively couple one of a received intermediate low voltage between the high voltage reference and ground reference and a received ground reference to the gate terminal of the first p-channel transistor;

wherein the first p-channel transistor includes a source/drain circuit connected on one side to the input node to generate on another side a first voltage limited input;

a first n-channel transistor having a gate terminal; and a second circuit to selectively one of a received intermediate high voltage between the high voltage reference and ground reference and a received high voltage reference to the gate terminal of the first n-channel transistor;

wherein the first n-channel transistor includes a source/drain circuit connected on one side to the input node to generate on another side a second voltage limited input.

15. The circuit of claim 14, further including a multistage input buffering circuit coupled to receive the first and second voltage limited inputs.

16. The circuit of claim 15, wherein the multistage input buffering circuit comprises a first inverter stage receiving the first and second voltage limited inputs, and a second inverter stage buffering an output of the first inverter stage to provide a circuit output.

17. The circuit of claim 16, wherein the first inverter stage comprises a first CMOS inverter circuit including source/drain circuit series connected transistors which are separately gate driven by the first and second voltage limited inputs and the intermediate low and high voltages.

18. The circuit of claim 17, wherein the first inverter stage comprises a second CMOS inverter circuit including source/drain circuit series connected transistors which are separately gate driven by the first and second voltage limited inputs, the intermediate low and high voltages, and source/drain interconnection node voltages taken from the first CMOS inverter circuit.

19. The circuit of claim 18, wherein the output of the first inverter stage is a center drain interconnection node of the source/drain circuit series connected transistors for the first CMOS inverter circuit which is connected to a center source interconnection node of the source/drain circuit series connected transistors for the second CMOS inverter circuit.

20. The circuit of claim 16, wherein the circuit output is fed back to the output of the first inverter stage through an additional inverter stage to form a Schmitt Trigger buffer stage.

* * * * *